United States Patent
Tsai et al.

(10) Patent No.: US 11,705,467 B2
(45) Date of Patent: Jul. 18, 2023

(54) DISPLAY DEVICE HAVING TRANSMITTANCE CONTROL FOR UNDER-DISPLAY CAMERA PIXELS, AND DRIVING METHOD THEREOF

(71) Applicant: Innolux Corporation, Miao-Li County (TW)

(72) Inventors: Chia-Hao Tsai, Miao-Li County (TW); Youcheng Lu, Miao-Li County (TW); Ming-Jou Tai, Miao-Li County (TW); Wei-Yen Chiu, Miao-Li County (TW); Yung-Hsun Wu, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/378,781

(22) Filed: Jul. 19, 2021

(65) Prior Publication Data

US 2022/0059586 A1     Feb. 24, 2022

(30) Foreign Application Priority Data

Aug. 18, 2020 (CN) .......................... 202010831165.9

(51) Int. Cl.
*H01L 27/146* (2006.01)
*G09G 3/20* (2006.01)

(52) U.S. Cl.
CPC ......... *H01L 27/14609* (2013.01); *G09G 3/20* (2013.01); *H01L 27/14621* (2013.01)

(58) Field of Classification Search
CPC .................... G09G 2300/0456; H01L 27/3234
See application file for complete search history.

(56) References Cited

U.S. PATENT DOCUMENTS

| | | | | |
|---|---|---|---|---|
| 2008/0100609 A1* | 5/2008 | Lee | ....................... | G09G 3/3291 345/212 |
| 2008/0106629 A1* | 5/2008 | Kurtz | ..................... | H04N 7/144 348/E5.022 |
| 2008/0165267 A1* | 7/2008 | Cok | ....................... | H04N 7/144 348/E5.022 |
| 2011/0102308 A1* | 5/2011 | Nakamura | ............. | H04N 7/144 345/84 |
| 2013/0050157 A1* | 2/2013 | Baek | .................... | G09G 3/2092 345/204 |
| 2015/0302812 A1* | 10/2015 | Jeong | ................... | G09G 3/3614 345/209 |
| 2017/0124965 A1* | 5/2017 | Verbeure | .............. | G09G 3/3611 |
| 2018/0211611 A1* | 7/2018 | Kato | ................. | G02F 1/134309 |
| 2019/0244579 A1* | 8/2019 | Oh | ........................ | G09G 3/2022 |
| 2019/0373166 A1* | 12/2019 | Jia | ........................ | G09G 3/2003 |
| 2019/0393286 A1* | 12/2019 | Ding | .................... | H01L 27/3246 |
| 2020/0075697 A1* | 3/2020 | Xu | ........................ | G09G 3/3233 |
| 2020/0111401 A1* | 4/2020 | Zhao | .................... | G09G 3/2003 |
| 2020/0135148 A1* | 4/2020 | Bai | ......................... | G09G 3/20 |
| 2021/0065625 A1* | 3/2021 | Wang | ................... | G09G 3/2074 |
| 2021/0084236 A1* | 3/2021 | Han | .................... | H04N 5/23293 |

(Continued)

*Primary Examiner* — Sepehr Azari
(74) *Attorney, Agent, or Firm* — JCIPRNET

(57) ABSTRACT

The disclosure provides a display device and a driving method thereof. The display device has a camera region. The camera region includes multiple camera pixels. In a display mode, multiple camera pixels are in a state that a light beam is not allowed to pass through. In a camera mode, multiple camera pixels are in a state that a light beam is allowed to pass through.

11 Claims, 8 Drawing Sheets

1E

(56) References Cited

U.S. PATENT DOCUMENTS

| | | | |
|---|---|---|---|
| 2021/0248945 A1* | 8/2021 | Liu | G09G 3/20 |
| 2021/0408439 A1* | 12/2021 | Wang | H01L 27/3234 |
| 2022/0013598 A1* | 1/2022 | Park | H01L 27/3218 |
| 2022/0148500 A1* | 5/2022 | Hsieh | G09G 3/20 |
| 2022/0223101 A1* | 7/2022 | Wu | G09G 3/2003 |

* cited by examiner

DISPLAY DEVICE HAVING TRANSMITTANCE CONTROL FOR UNDER-DISPLAY CAMERA PIXELS, AND DRIVING METHOD THEREOF

CROSS-REFERENCE TO RELATED APPLICATION

This application claims the priority benefit of China application serial no. 202010831165.9, filed on Aug. 18, 2020. The entirety of the above-mentioned patent application is hereby incorporated by reference herein and made a part of this specification.

BACKGROUND

1. Technical Field

The disclosure relates to an electronic device, in particular to a display device and a driving method thereof.

2. Description of Related Art

In order to meet the design requirements of narrow borders or no borders, some technologies such as placing the camera module below the display module have been proposed. In this way, the design requirements of narrow border or no border can be satisfied, and it is possible to take a picture or photograph while displaying the screen. However, in the process of imaging, the light transmission state of the display module located above the camera module will affect the imaging quality, so how to balance the display quality and the imaging quality has become one of the problems that developers are eager to solve.

SUMMARY

The disclosure provides a display device and a driving method thereof, which helps to balance display quality and imaging quality.

According to an embodiment of the disclosure, the display device includes a camera region. The camera region includes multiple camera pixels. In a display mode, the multiple camera pixels are in a state that a light beam is not allowed to pass through. In a camera mode, the multiple camera pixels are in a state that a light beam is allowed to pass through.

According to an embodiment of the disclosure, the display device includes a camera region. The camera region includes multiple camera pixels. The driving method of display device includes: placing the multiple camera pixels in a state that a light beam is not allowed to pass through, in a display mode; and placing the multiple camera pixels in a state that a light beam is allowed to pass through, in a camera mode.

BRIEF DESCRIPTION OF THE DRAWINGS

The accompanying drawings are included to provide a further understanding of the disclosure, and are incorporated in and constitute a part of the disclosure. The drawings illustrate embodiments of the disclosure and, together with the description, serve to explain the principles of the disclosure.

DESCRIPTION OF THE EMBODIMENTS

Figure 1:
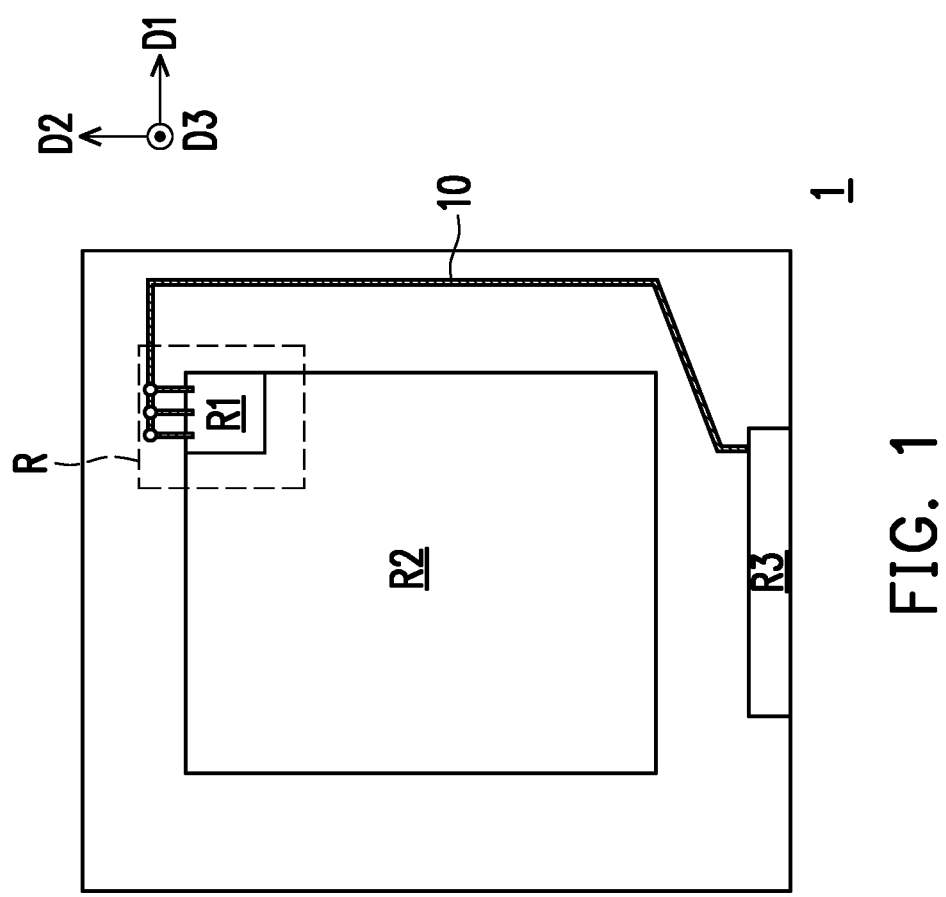
FIG. 1 is a schematic top diagram of a display device according to the first embodiment of the disclosure.

The disclosure may be understood by referring to the following detailed description in conjunction with the accompanying drawings. It should be noted that in order to make it easy for the readers to understand and for the concise of the diagrams, only a part of the electronic devices/display device is drawn in the various diagrams in the disclosure. Moreover, the specific components in the drawings are not drawn according to actual scale. In addition, the number and size of each component in the drawings are only for illustration, and are not used to limit the scope of the disclosure. For example, for the sake of clarity, the relative size, thickness, and position of each film layer, region, or structure may be reduced or enlarged.

Certain terms are used throughout the specification and appended claims of the disclosure to refer to specific components. Those skilled in the art should understand that electronic device manufacturers may refer to the same components by different names. The disclosure does not intend to distinguish between components that have the same function but different names. In the following specification and claims, terms such as "including", "containing", and "having" are open-ended terms, so should be interpreted as meaning "including but not limited to . . . ."

The directional terms mentioned in this article, such as "upper", "lower", "front", "rear", "left", "right", and the like, are just references to the direction of the attached drawings. Therefore, the directional terms used are to illustrate, but not to limit the disclosure. It should be understood that when a component or film layer is referred to as being disposed "on" another component or film layer, or being "connected to" another component or film layer, it may be directly disposed on or directly connected to this other component or film layer, or there may be a component or film layer inserted in between (indirection situation). On the other hand, when a component is referred to as being "directly on" or "directly connected" to another component or film, there is no component or film layer inserted in between.

In some embodiments of the disclosure, terms related to bonding and connection, such as "connected", "interconnected", and the like, unless specifically defined, may mean that two structures are in direct contact, or that two structures are not in direct contact, where there are other structures located between the two structures. The terms of bonding and connection may also include the case where both structures are movable or both structures are fixed. In addition, the terms "electrical connection" and "coupling" include any direct and indirect electrical connection means.

Terms such as "first", "second", and the like in the specification and claims are used to name different components or to distinguish different embodiments or ranges, and are not intended to limit the upper limit or lower limit of the number of the components. Nor do they represent the manufacturing order or the disposition order of the components.

The electronic device disclosed in the disclosure may include, for example, display device, antenna device, sensing device, light emitting device, touch display, curved display, or free shape display, but the disclosure is not limited thereto. The display may also be a bendable or flexible device. The electron device may, for example, include liquid crystal, light emitting diode, quantum dot (QD), fluorescence, phosphor, other suitable display media, or a combination of the aforementioned material, but the disclosure is not limited thereto. The light-emitting diode may include, for example, organic light-emitting diode (OLED), sub-millimeter light-emitting diode (mini LED), micro-light-emitting diode (micro LED), quantum dot light-emitting diode (including QLED, QDLED), other suitable materials, or a combination of the above, but the disclosure is not limited to thereto. The display device may, for example, include the splicing display device, but the disclosure is not limited thereto. The antenna device may be, for example, a liquid crystal antenna, but the disclosure is not limited thereto. The antenna device may, for example, include an antenna splicing device, but the disclosure is not limited thereto. It should be noted that the electronic device may be any combination of the foregoing, but the disclosure is not limited thereto. Moreover, the appearance of the electronic device may be rectangular, circular, polygonal, a shape with curved edges, or other suitable shapes. The electronic device may have peripheral systems such as driving system, control system, light source system, rack system, and the like, so as to support a display device, an antenna device, or a splicing device. The following description takes a display device as an example so as to illustrate the disclosure, but the disclosure is not limited thereto.

It should be noted that in the following embodiments, the technical features of several different embodiments may be replaced, reorganized, and mixed without departing from the spirit of the disclosure so as to complete other embodiments. The technical features of the embodiments may be mixed and matched arbitrarily as long as they do not violate the spirit of the disclosure or conflict with each other.

Figure 2:
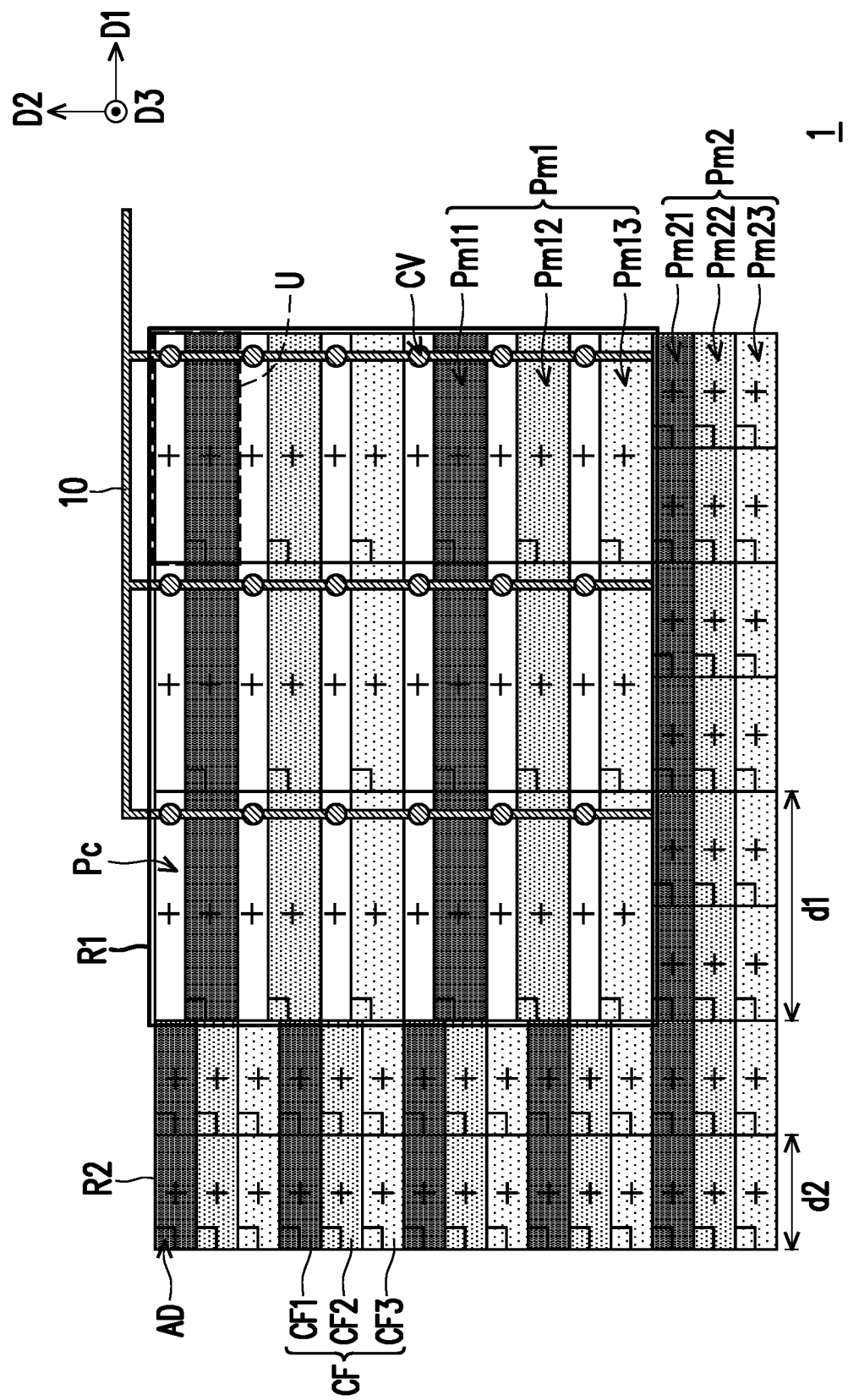
FIG. 2 is an enlarged schematic diagram of the region R in FIG. 1.

FIG. 1 is a schematic top diagram of a display device according to the first embodiment of the disclosure. FIG. 2 is an enlarged schematic diagram of the region R in FIG. 1.

Referring to FIGS. 1 and 2, a display device 1 of the disclosure may be a non-self-luminous display device. The non-self-luminous display device may include liquid crystal display device, but the disclosure is not limited thereto. The liquid crystal display device may be a liquid crystal display device that is in a dark state when no voltage is applied and is in a bright state when a voltage is applied, or may be a liquid crystal display device that is in a bright state when no voltage is applied and is a dark state when a voltage is applied, but no restriction is imposed here. For the detailed structure of the liquid crystal display device, reference can be made to the existing design, which will not be repeated here.

The display device 1 may include a display mode and a camera mode. In the display mode, the display device 1 provides a display function. In a camera mode, the display device 1 provides a shooting function. According to different requirements, the display device 1 may also provide a display function in the camera mode. For example, the display device 1 may display the acquired image while acquiring the image of a shooting subject but the disclosure is not limited thereto.

In detail, the display device 1 may include a camera region R1. FIG. 1 schematically shows a square camera region R1, and the camera region R1 is disposed adjacent to one of the corners of the display device 1. However, it should be understood that the number, the disposition position, or the top view shape of the camera regions R1 and the like may be changed as required.

The camera region R1 may be configured to obtain an image of a shooting subject. In detail, referring to FIG. 2, the camera region R1 may include multiple camera pixels Pc. The driving method of the display device 1 includes: placing the multiple camera pixels Pc in a state that a light beam is not allowed to pass through, in a display mode; and placing the multiple camera pixels Pc in a state that a light beam is allowed to pass through, in a camera mode. In other words, in the display mode, the multiple camera pixels Pc are in a state that a light beam is not allowed to pass through; that is, the multiple camera pixels Pc are in a dark state in the display mode. On the other hand, in the camera mode, the multiple camera pixels Pc are in a state that a light beam is allowed to pass through; that is, the multiple camera pixels Pc are in a bright state in the camera mode.

With the multiple camera pixels Pc being in a state that a light beam is allowed to pass through, in the camera mode, it helps to increase the light transmittance of the multiple camera pixels Pc in the camera mode, such that the camera module located in the camera region R1 can receive more image light beams from the shooting subject, thereby helping to improve the imaging quality. In some embodiments, the camera region R1 may also include other sensing devices, such as fingerprint sensor, iris sensor, retina sensor, face sensor, in sensor, a movement sensor, gesture sensor, proximity sensor or other suitable sensors; the disclosure is not limited thereto.

With the multiple camera pixels Pc being in a state that a light beam is not allowed to pass through, in the display mode, in some embodiments, the multiple camera pixels Pc may be equivalent to a black matrix in the display mode. That is, in the display mode, the multiple camera pixels Pc may be configured to block light leakage, block stray light, or block elements that are not intended to be seen by the user, or may be configured to enhance contrast. In some embodiments, the camera region R1 may further include multiple first display pixels Pm1. The multiple first display pixels Pm1 may provide a display function in the display mode. According to different requirements, the multiple first display pixels Pm1 may also provide a display function in the camera mode.

For example, the first display pixel Pm1 may emit a single color light, and the multiple first display pixels Pm1 may include multiple first blue pixels Pm11, multiple first green pixels Pm12, and multiple first red pixels Pm13. Each of the multiple first blue pixels Pm11, the multiple first green pixels Pm12, and the multiple first red pixels Pm13 may be disposed in a first direction D1, and the multiple first blue pixels Pm11, the multiple first green pixels Pm12, and the multiple first red pixels Pm13 may be alternately disposed in a second direction D2. The second direction D2 intersects the first direction D1, and the second direction D2 may be perpendicular to the first direction D1, but the disclosure is not limited thereto. The first direction D1 and the second direction D2 are both perpendicular to a thickness direction (such as a third direction D3) of the display device 1. However, it should be understood that the color type, number, shape or disposition of the pixels in the multiple first display pixels Pm1 may be changed according to requirements. In some embodiments, the first direction D1 may be, for example, an extending direction of a scan line (not shown) in the display device 1, but the disclosure is not limited thereto.

In some embodiments, the multiple camera pixels Pc and the multiple first display pixels Pm1 may be alternately disposed in the second direction D2. FIG. 2 schematically shows a pixel unit U, and the labeled pixel unit U includes one camera pixel Pc and one first blue pixel Pm11. However, it may be understood from FIG. 2 that the camera region R1 may include the multiple pixel units U, and each of the multiple pixel units U may include one camera pixel Pc and one first display pixel Pm1 (such as one first blue pixel Pm11, one first green pixel Pm12 or one first red pixel Pm13). In other embodiments, each of the multiple pixel units U may also include a camera pixel Pc and multiple first display pixels (such as a combination of a first blue pixel Pm11, a first green pixel Pm12, and a first red pixel Pm13), but the disclosure is not limited thereto).

The display device 1 may further include a display region R2. The display region R2 is adjacent to the camera region R1. FIG. 1 schematically shows that the camera region R1 is located at an upper right corner of the display region R2. However, the respective number, the relative disposition relationship, the top view shape, the area ratio or the like of the camera region R1 and of the display region R2 may be changed according to requirements. For example, the camera region R1 may also be located at an upper left corner of the display region R2 or in the middle of one of the sides of the display region R2. Alternatively, the display device 1 may include the multiple camera regions R1, and the multiple camera regions R1 may be located at multiple corners or at the middle of multiple sides of the display region R2, or a combination of the above, but the disclosure is not limited thereto.

In the display mode, the display region R2 may provide a display function. According to different requirements, the display region R2 may also provide a display function in the camera mode. For example, the display region R2 and the camera region R1 may jointly provide the image captured by the camera region R1 in the camera mode, but the disclosure is not limited thereto.

In detail, proceeding to refer to FIG. 2, the display region R2 may include multiple second display pixels Pm2. The second display pixel Pm2 may emit a single color light. The multiple second display pixels Pm2 may include multiple second blue pixels Pm21, multiple second green pixels Pm22, and multiple second red pixels Pm23. Each of the multiple second blue pixels Pm21, the multiple second green pixels Pm22, and the multiple second red pixels Pm23 may be disposed in the first direction D1, and the multiple second blue pixels Pm21, the multiple second green pixels Pm22, and the multiple second red pixels Pm23 may be alternately disposed in the second direction D2. However, it should be understood that the color type, number, or disposition of the pixels in the multiple second display pixels Pm2 may be changed according to requirements.

In some embodiments, a resolution of the camera region R1 may be lower than a resolution of the display region R2 so as to reduce negative impact of diffraction or interference of the light beam (such as the image light beam from the shooting subject) on the imaging quality. In other embodiments, a pixel pitch d1 in the first direction D1 of two adjacent first red pixels Pm13 in the camera region R1 is greater than a pixel pitch d2 in the first direction D1 of the two adjacent first red pixels Pm13 in the display area R2.

In some embodiments, the multiple camera pixels Pc, the multiple first display pixels Pm1 (including the multiple first blue pixels Pm11, the multiple first green pixels Pm12, and the multiple first red pixels Pm13), and the multiple second display pixels Pm2 (including the multiple second blue pixels Pm21, the multiple second green pixels Pm22, and the multiple second red pixels Pm23) may have a same polarity.

Figure 4:
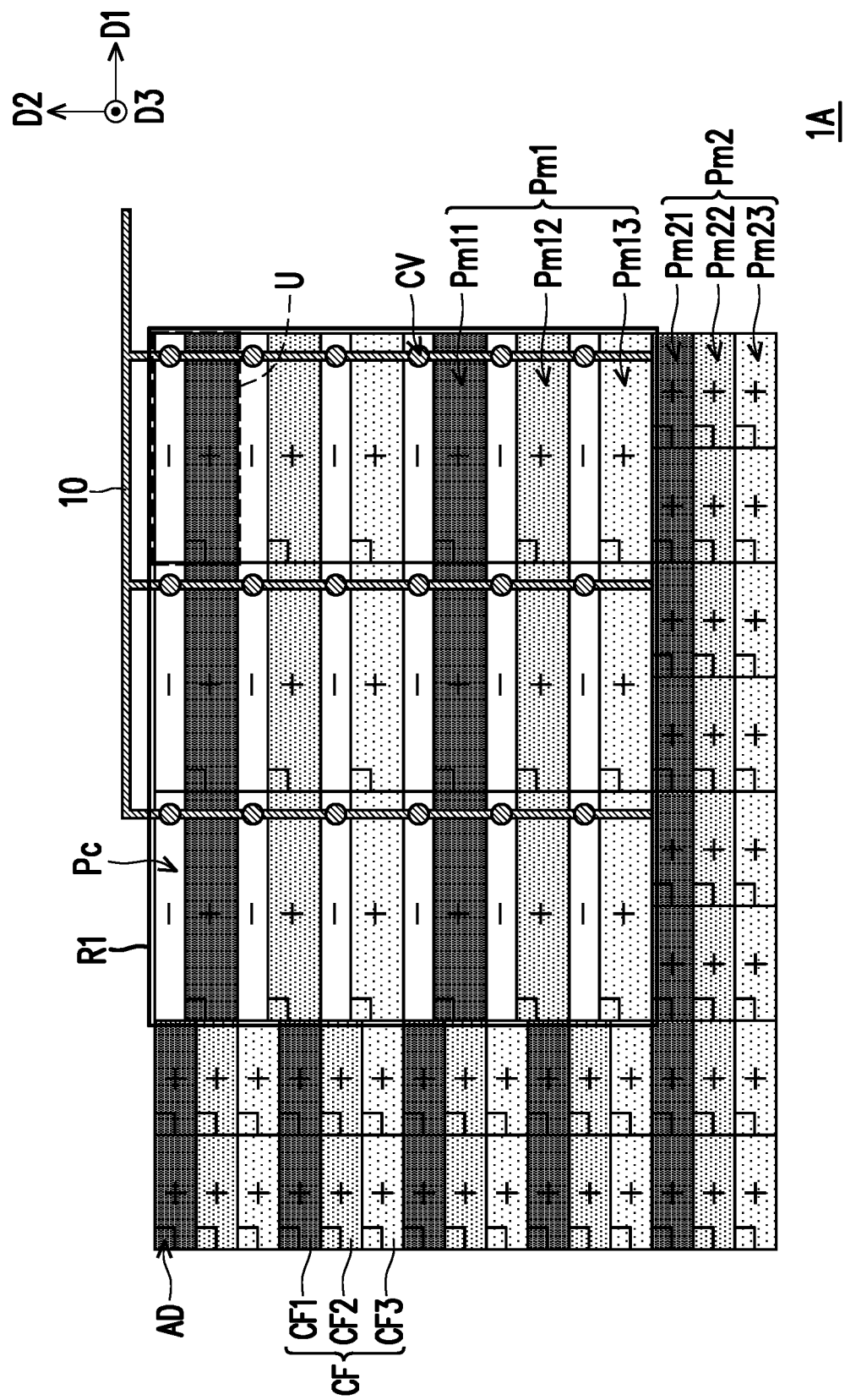
FIGS. 4 to 8 are schematic partial top diagrams of display devices according to the second embodiment to the sixth embodiment of the disclosure, respectively.

For example, by frame inversion, the polarities of the multiple camera pixels, the multiple first display pixels Pm1, and the multiple second display pixels Pm2 may be made all positive (represented by "+" in FIG. 2), or the polarities of the multiple camera pixels Pc, the multiple first display pixels Pm1, and the multiple second display pixels Pm2 may be made all negative (not shown in FIG. 2; represented by "−" in FIG. 4). When an absolute value of a voltage difference is fixed, the polarity may be changed by making the voltage of the pixel electrode higher than the voltage of the common electrode or making the voltage of a pixel electrode lower than the voltage of a common electrode. Through polarity change, feature damage caused by liquid crystal molecule orientation to always be fixed in one direction can be reduced. It should be understood that the camera pixel Pc, the first display pixel Pm1, and the second display pixel Pm2 each have a pixel electrode and a common electrode, where the pixel electrodes of the camera pixel Pc, of the first display pixel Pm1, and of the second display pixel Pm2 are separated from each other. On the other hand, the common electrodes of the camera pixel Pc, of the first display pixel Pm1, and of the second display pixel Pm2 may be separated from each other or connected to each other (such as being different parts of a continuous electrode). Based on different design considerations (such as light transmittance, contrast, or light leakage blocking, etc.), in each of the multiple pixel units U, a ratio of an area of the camera pixel Pc to an area of the one (or more) first display pixels Pm1 may fall within a range of 0.04 to 25 (0.04≤area ratio≤25). For example, one pixel unit U may include one camera pixel Pc and at least three first display pixels Pm1, and the ratio of the area of one camera pixel Pc to a total area of the at least three first display pixels Pm1 may fall within a range of 0.04 to 25. In some embodiments, the area of the first display pixel Pm1 may be, for example, the area of the pixel electrode of the first display pixel Pm1, and the area of the camera pixel Pc may be, for example, an area of the pixel electrode of the camera pixel Pc. In other embodiments, the area of the first display pixel Pm1 may be, for example, an area of a smallest imaginary rectangle surrounding the pixel electrode of the first display pixel Pm1, and the area of the camera pixel Pc may be, for example, an area of another smallest imaginary rectangle surrounding the pixel electrode of the camera pixel Pc, but the disclosure is not limited thereto. The material of the pixel electrode and the common electrode may include a transparent conductive material, such as indium tin oxide (ITO), but the disclosure is not limited thereto.

According to different requirements, the display device 1 may further include other elements or film layers. For example, the display device 1 may further include multiple active elements AD and multiple color filter patterns CF. The multiple active elements AD and the multiple color filter patterns CF are located outside the multiple camera pixels Pc (that is, each camera pixel Pc may not need to include the active element AD and the color filter pattern CF) and located in the multiple first display pixels Pm1 and the multiple second display pixels Pm2. In detail, the color filter pattern CF may at least partially overlap the pixel electrodes of the multiple first display pixels Pm1 and the pixel electrodes of the multiple second display pixels Pm2, and the color filter pattern CF may not need to overlap the pixel electrodes of the multiple camera pixels Pc.

The active element AD may be used as a switching element. For example, the active element AD may include a thin film transistor, but the disclosure is not limited thereto. In some embodiments, each display pixel (such as the first blue pixel Pm11, the first green pixel Pm12, the first red pixel Pm13, the second blue pixel Pm21, the second green pixel Pm22, or the second red pixel Pm23) may include one or more active elements AD. Further, at least one active element AD in each display pixel is electrically connected to a scan line (not shown) and a data line (not shown) in the display device 1 so as to control signal input, but the disclosure is not limited thereto.

The color filter pattern CF allows specific light beams to pass through and filters out the remaining light beams so as to provide color display. For example, the multiple color filter patterns CF may include multiple blue filter patterns CF1, multiple green filter patterns CF2, and multiple red filter patterns CF3. The multiple blue filter patterns CF1 are located in the multiple first blue pixels Pm11 and the multiple second blue pixels Pm21; the multiple green filter patterns CF2 are located in the multiple first green pixels Pm12 and the multiple second green pixels Pm22; and the multiple red filter patterns CF3 are located in the multiple first red pixels Pm13 and the multiple second red pixels Pm23.

Compared with the first display pixel Pm1 and the second display pixel Pm2 for displaying images (including gray-scale and color changes), the camera pixel Pc is configured to adjust the light transmittance. For example, the camera pixel Pc switches between the camera mode and the display mode. Since the camera pixel Pc may not need to provide color display, the camera pixel Pc may not need to include the color filter pattern CF. In some embodiments, the camera pixel Pc may be electrically connected to one or more pins that output high voltage and low voltage in a driving element (such as a driver chip) so as to switch between the display mode and the camera mode. In this way, the camera pixel Pc may not need to include the active elements AD. For example, the display device 1 may further include a wire 10 and an outer lead bonding (OLB) region R3. The outer lead bonding region R3 may be provided with, for example, a flexible printed circuit board (FPC), a chip on film (COF) or related display driving circuits/elements. Moreover, the multiple camera pixels Pc may be electrically connected to the driving circuit or the driving element in the outer lead bonding region R3 through the wire 10. In some embodiments, the wire 10 may be in a different layer from the scan line and the data line. For example, the wire 10 may be disposed above the scan line and the data line and electrically connected to the pixel electrode in the camera pixel Pc through a conductive through hole CV, but the disclosure is not limited thereto. In some embodiments, the wire 10 may be fabricated together with the pixel electrode or the common electrode, that is, the wire 10 may be in the same layer as the pixel electrode or the common electrode.

With the multiple camera pixels Pc being electrically connected to the driving elements through the wire 10, there is no need to provide active elements in the camera pixels Pc, thereby helping to reduce the number of wires or elements required, increase the aperture ratio, or reduce the diffraction or interference of light beams. Moreover, referring to FIG. 2, the multiple camera pixels Pc may have a same polarity, such that the multiple camera pixels may be electrically connected to the wire 10, thus the number of the wires 10 connected between the multiple camera pixels Pc and the driving element can be reduced, and the wire 10 has low influence on the border. In some embodiments, as shown in FIG. 1, the multiple camera pixels Pc may be electrically connected to the driving element through the wire 10. In other embodiments, the number of wires 10 may also be increased, and different wires 10 may be connected to multiple pins of the driving element so as to reduce the resistive-capacitive loading. With the design of electrically connecting the multiple camera pixels Pc and the driving element through the multiple wires 10 the multiple wires 10 may extend from the multiple camera pixels Pc through a same side or an opposite side of the display region R2 (such as the left and right sides of the display region R2 as shown in FIG. 1) to the driving element. Considering the influence of inconsistent wire length on impedance, it is possible to make a longer wire have a larger line width and a shorter wire to have a smaller line width, or make multiple wires 10 extend from the multiple camera pixels Pc through the same side of the display area R2 to the driving element, such that wires of different lengths have the same or close to the same resistive-capacitive loading (RC loading). Alternatively, the camera region R1 may also be disposed in the center so as to maintain the design of double-sided routing.

In some embodiments, for example, an oscilloscope may be configured to measure the signal and/or the waveform provided by the data line (not shown) or the wire 10. When operating an electronic device, at least one data line or at least one wire 10, for example, provides a square wave signal. The square wave signal can be, for example, a positive/negative alternating current signal, and the positive/negative polarities of the first display pixel Pm1, the second display pixel Pm2, and the camera pixel Pc can be determined according to the positive/negative of the square wave signal, but this disclosure is not limited such thereto.

Figure 3:
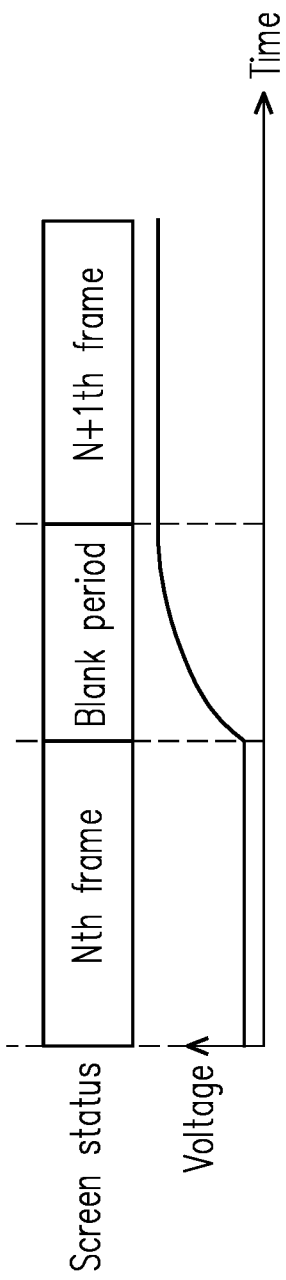
FIG. 3 is a schematic timing diagram for displaying state switching of multiple camera pixels.

FIG. 3 is a schematic timing diagram for displaying state switching of multiple camera pixels. Referring to FIG. 3, the transition time of the multiple camera pixels (such as the switching time between the display mode and the camera mode) increases as the number of camera pixels in the camera region increases. In some embodiments, the transition time of the camera pixel may be at least 20 times the transition time of the display pixel (such as the first display pixel or the second display pixel). At this time, the state switching of the multiple camera pixels may be made to occur in the blanking time between two adjacent frames (such as the Nth frame and the N+1th frame), that is, the mode of the camera pixel is switched in the blanking time between the intervals of the adjacent two updated display screens. In other embodiments, the camera pixels may be connected to multiple wires so as to reduce the capacitive loading. Therefore, the camera pixels may be switched at the same time as is the Nth frame or the N+1th frame (that is, the screen switching of the camera pixels do not need to occur in the blanking time between the intervals of two frames).

FIGS. 4 to 8 are schematic partial top diagrams of display devices according to the second embodiment to the sixth embodiment of the disclosure, respectively. In the following embodiments, the same or similar elements will use the same or similar reference numerals, and redundant description will be omitted. Moreover, the features in different embodiments may be mixed and matched arbitrarily as long as they do not violate the spirit of the disclosure or conflict with each other, and simple equivalent changes and modifications made in accordance with this specification or claims are still within the scope of this disclosure.

Please refer to FIG. 4, in a display device 1A, the multiple first display pixels Pm1 (including the multiple first blue pixels Pm11, the multiple first green pixels Pm12, and the multiple first red pixels Pm13) and the multiple second display pixels Pm2 (including the multiple second blue pixels Pm21, the multiple second green pixels Pm22, and the multiple second red pixels Pm23) have the same polarity, and the polarities of the multiple camera pixels Pc are opposite to the polarities of the multiple first display pixels Pm1 and the multiple second display pixels Pm2. In other words, in the pixel unit U, the camera pixel Pc and the first display pixel Pm1 (such as the first blue pixel Pm11, the first green pixel Pm12, or the first red pixel Pm13) have opposite polarities. By making the multiple camera pixels Pc and the multiple first display pixels Pm1 in the camera region R1 have opposite polarities, it is helpful to increase the light transmittance. In the present embodiment, the polarity of any one of the multiple camera pixels Pc, the multiple first display pixels Pm1, and the multiple second display pixels Pm2 may be switched by, for example, frame inversion.

Figure 5:
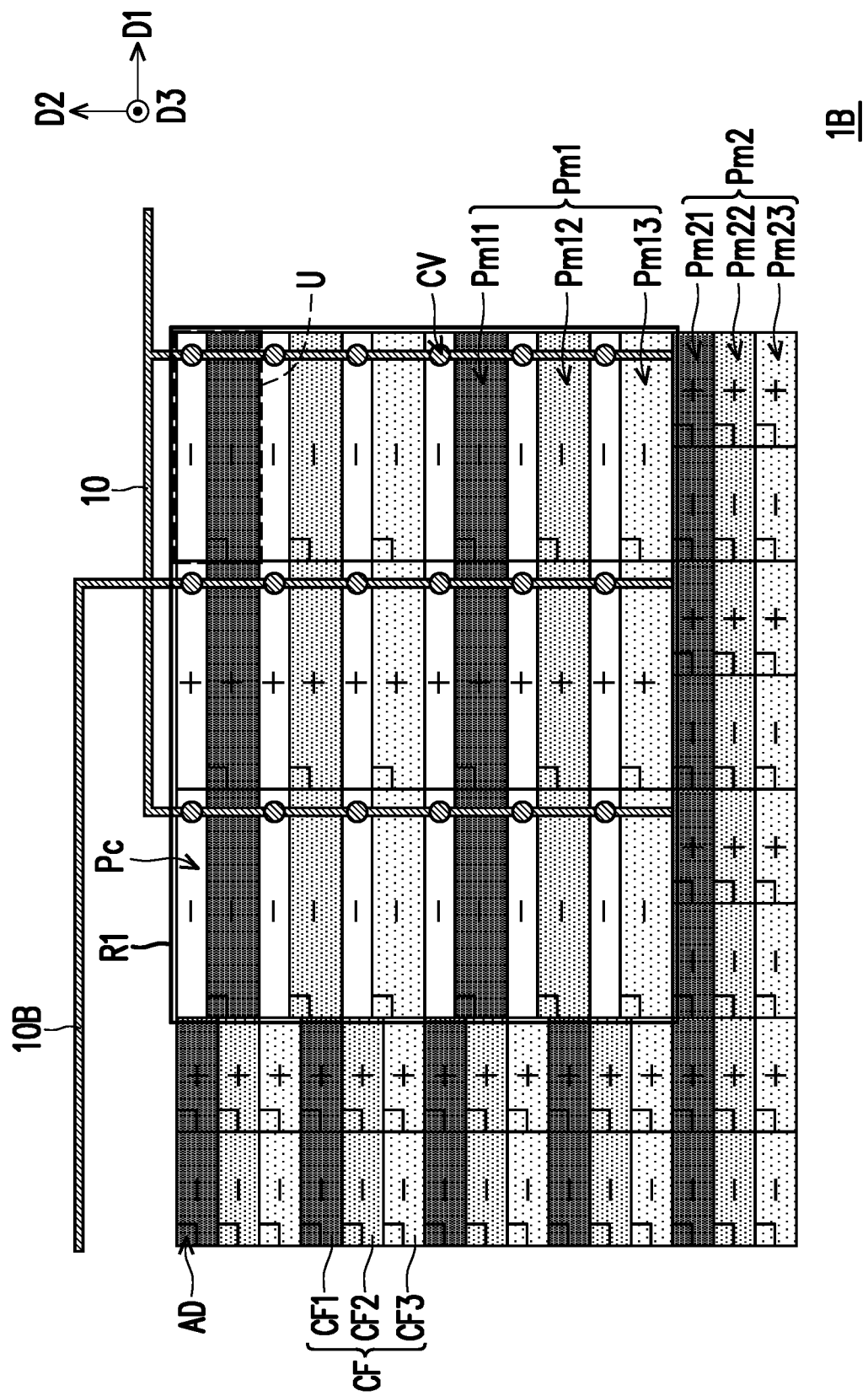

Referring to FIG. 5, in a display device 1B, each of the multiple camera pixels Pc, the multiple first display pixels Pm1, and the multiple second display pixels Pm2 has an alternating positive/negative polarity in the first direction D1, and each of the multiple camera pixels Pc, the multiple first display pixels Pm1, and the multiple second display pixels Pm2 has the same polarity in the second direction D2. Moreover, in the pixel unit U, the camera pixel Pc and the first display pixel Pm1 (such as the first blue pixel Pm11, the first green pixel Pm12, or the first red pixel Pm13) have the same polarity. In some embodiments, the camera pixels Pc of opposite polarities may be connected to multiple pins of the driving element through different wires (such as the wire 10 and a wire 10B). Using multiple pins to control the state of the multiple camera pixels Pc (such as display mode or camera mode) helps reduce the resistive-capacitive loading.

As mentioned above, considering the influence of inconsistent wire lengths on impedance, it is possible to make a longer wire have a larger line width and a shorter wire to have a smaller line width, or make multiple wires (such as the wire 10 and the wire 10B) extend from the multiple camera pixels Pc to the driving element through the same side of the display area R2 (see FIG. 2), such that wires of different lengths have the same or close to the same resistive-capacitive loading. Alternatively, the camera region R1 may also be disposed in the center so as to maintain the design of double-sided routing.

In the present embodiment, the polarity of any one of the multiple camera pixels Pc, the multiple first display pixels Pm1, and the multiple second display pixels Pm2 may be switched by, for example, column inversion. The polarity conversion method of column inversion helps to reduce crosstalk.

Figure 6:
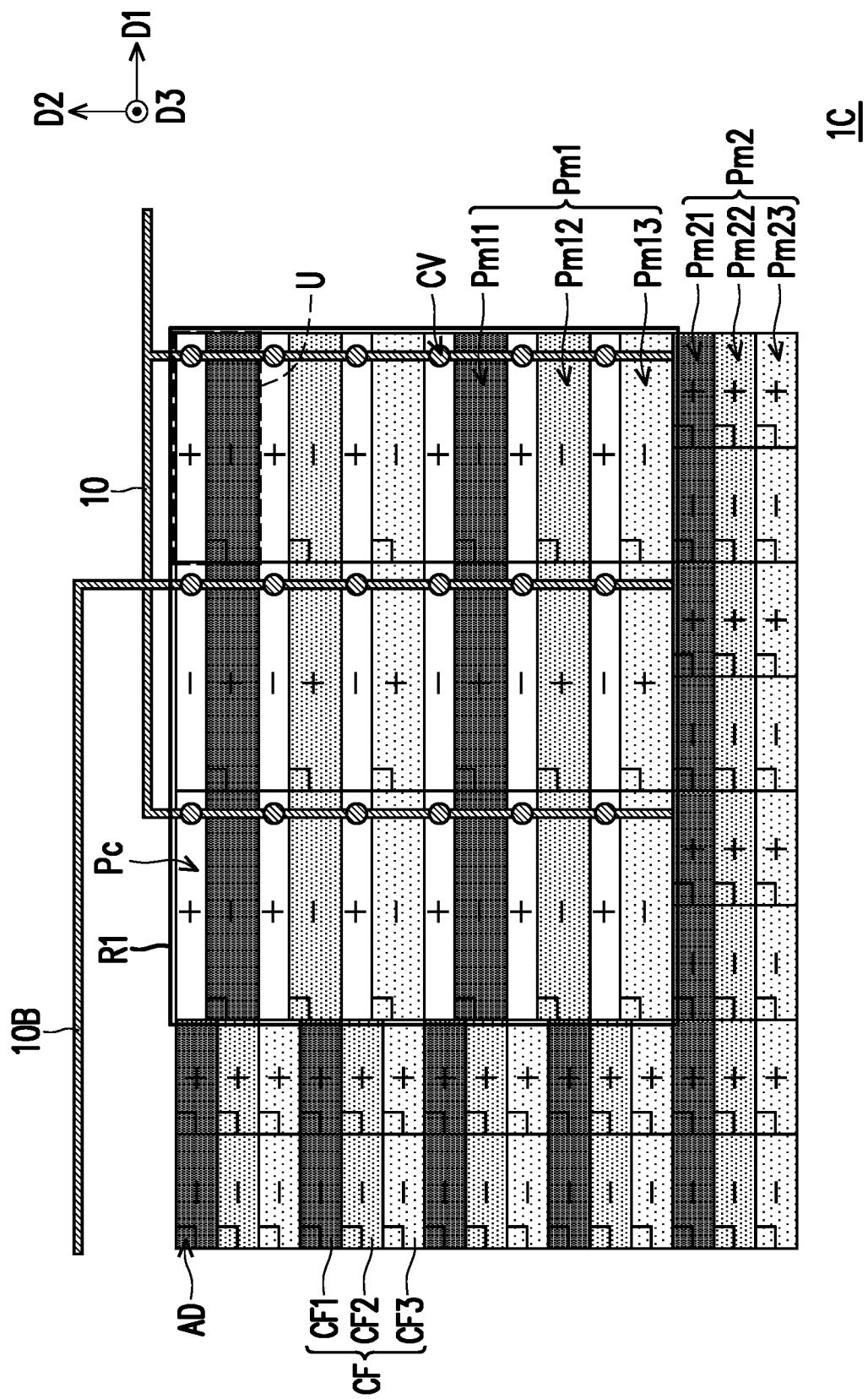

Referring to FIG. 6, the main difference between a display device 1C and the display device 1B of FIG. 5 is: in the pixel unit U of the display device 1C, the camera pixel Pc and the first display pixel Pm1 (such as the first blue pixel Pm11, the first green pixel Pm12, or the first red pixel Pm13) have opposite polarities, which helps to increase the light transmittance.

Figure 7:
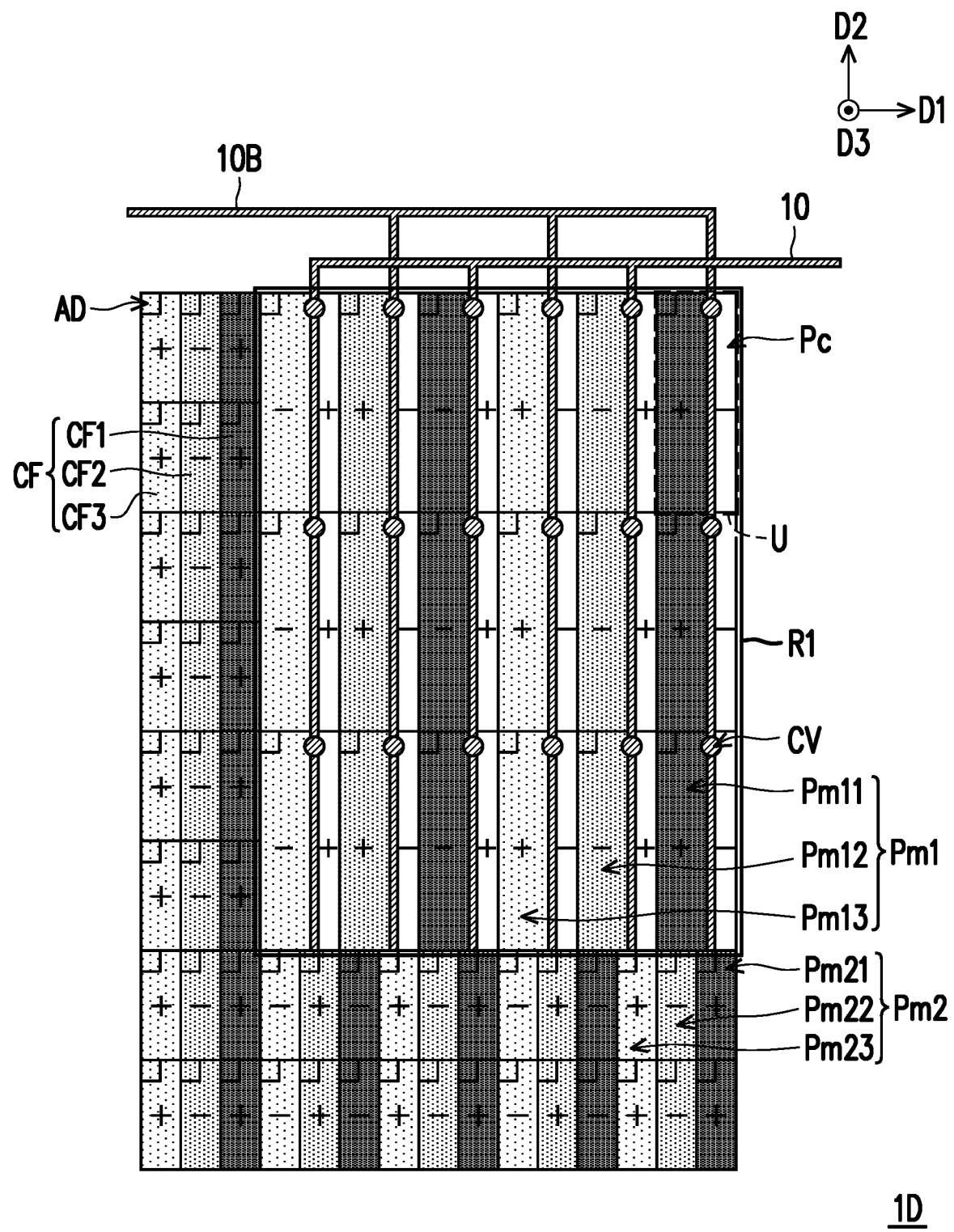

Please refer to FIG. 7, the main difference between a display device 1D and the display device 1C of FIG. 6 is: in the display device 1D, the multiple camera pixels Pc, the multiple first display pixels Pm1, and the multiple second display pixels Pm2 are disposed 90 degrees rotated. In other embodiments, the polarity design of various pixels in the display device 1D may also be changed to the polarity design shown in FIG. 2, FIG. 4, or FIG. 5, which will not be repeated here.

Figure 8:
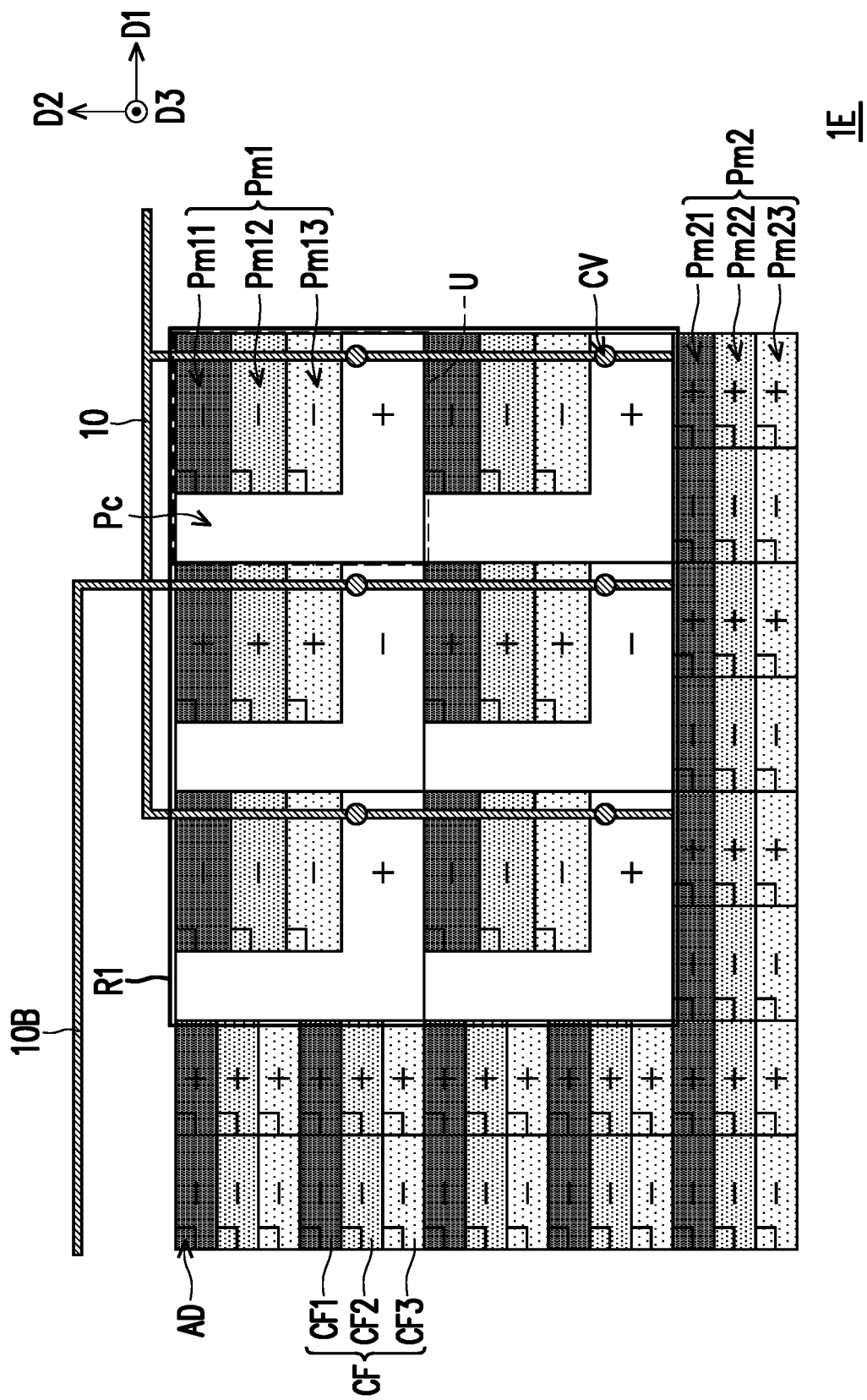

Please refer to FIG. 8, the main difference between a display device 1E and the display device 1C of FIG. 6 lies in the design of the pixel unit U. In the display device 1E, the pixel unit U includes a camera pixel Pc and three first display pixels Pm1 (such as one first blue pixel Pm11, one first green pixel Pm12, and one first red pixel Pm13), and the ratio of the area of the camera pixel Pc to the total area of the three first display pixels Pm1 may fall within a range of 0.04 to 25. In other embodiments, one pixel unit U nay include one camera pixel Pc and multiple first display pixels Pm1. However, it should be understood that design parameters such as the shape of the pixel unit U, the shape, number, distribution, disposition, and area ratio of the camera pixel Pc or the first display pixel Pm1 in the pixel unit U may be changed according to requirements. In other embodiments, the polarity design of various pixels in the display device 1E may also be changed to the polarity design shown in FIG. 2, FIG. 4, or FIG. 5, which will not be repeated here.

In summary, in the embodiments of the disclosure, with the multiple camera pixels being in a state that a light beam is allowed to pass through, in the camera mode, it helps to increase the light transmittance of the multiple camera pixels, in the camera mode, such that the camera module located in the camera region can receive more image light beams from the shooting subject, thereby helping to improve the imaging quality. With the multiple camera pixels being in a state that a light beam is not allowed to pass through, in the display mode, which helps to block light leakage, block stray light, block elements that are not intended to be seen by the user, or improve contrast.

In some embodiments, the resolution of the camera region may be lower than the resolution of the display region so as to reduce the negative influence of the diffraction or interference of the light beam on the imaging quality. In some embodiments, the multiple camera pixels may be electrically connected to the driving element through the wire so as to reduce the number of wires or elements required, to increase the aperture ratio, or to reduce the diffraction or interference of the light beam. In some embodiments, a wire may be configured to electrically connect the multiple camera pixels and the driving element, so as to reduce the influence of the wire on the border. In some embodiments, the number of wires may be increased, and different wires may be connected to multiple pins of the driving element so as to reduce the resistive-capacitive loading. In some embodiments, the line width of the wire, the disposition position of the wire, or the position of the camera region may be adjusted so as to make the wires of different lengths have the same or close to the same resistive-capacitive loading. In some embodiments, the state switching of the multiple camera pixels may be made to occur in a blanking time between two frames. In some embodiments, the light transmittance can be increased by making the multiple camera pixels and the multiple first display pixels in the camera region have opposite polarities. In some embodiments, by column inversion, the crosstalk can be reduced by changing the polarity.

The above embodiments are only configured to illustrate the technical solutions of the disclosure, but the disclosure is not limited thereto. Although the disclosure has been described in detail with reference to the foregoing embodiments, those of ordinary skill in the art should understand that they may still modify the technical solutions described in the foregoing embodiments, or equivalently replace some or all of the technical features. Further, the modifications or replacements do not cause sprit of the corresponding technical solutions to deviate from the scope of the technical solutions of the embodiments of the disclosure.

Although the embodiments of the disclosure and the advantages have been disclosed as above, it should be understood that any person skilled in the art, without departing from the spirit and scope of the disclosure, may make changes, substitutions and modifications, and the features between the embodiments can be mixed and replaced at will so as to form other new embodiments. In addition, the protection scope of the disclosure is not limited to the manufacturing processes, machines, manufacturing, material composition, devices, methods, and steps in the specific embodiments described in the specification. Anyone skilled in the art may understand the current or future development processes, machines, manufacturing, material composition, devices, methods, and steps from the disclosure of this disclosure, and use the same according to the disclosure, as long as substantially the same functions can be implemented in the embodiments described herein or substantially the same results can be obtained. Therefore, the protection scope of the disclosure includes the above-mentioned manufacturing processes, machines, manufacturing, material composition, devices, methods, and steps. In addition, each claim constitutes an individual embodiment, and the protection scope of the disclosure also includes the combination of each claim and embodiment. The scope of protection of this disclosure should be defined by the appended claims.

Finally, it should be noted that the above embodiments are only used to illustrate the technical solution of the disclosure, but not limited thereto. Although the disclosure is described in detail with reference to the above-mentioned embodiments, those skilled in the art should understand that the technical solutions described in the above-mentioned embodiments may still be modified, and some or all of the technical features may be replaced equivalently; such modifications or replacements do not depart from the scope of the technical solutions described by the embodiments of the disclosure.

What is claimed is:

1. A display device, comprising a camera region and a display region adjacent to the camera region, wherein the camera region comprises a plurality of camera pixels and a plurality of first display pixels and the display region comprises a plurality of second display pixels, wherein
    in a display mode, the plurality of camera pixels are in a state that a light beam is not allowed to pass through;
    in a camera mode, the plurality of camera pixels are in a state that a light beam is allowed to pass through;
    the plurality of camera pixels have an alternating positive/negative polarity in a first direction, the plurality of first display pixels have an alternating positive/negative polarity in the first direction, the plurality of second display pixels have an alternating positive/negative polarity in the first direction, the plurality of first display pixels have a same polarity in a second direction, the plurality of second display pixels have a same polarity in the second direction;
    each of the plurality of camera pixels is opposite in polarity to adjacent first display pixel or first display pixels; and
    each of the plurality of first display pixels comprises four edges, and each of the plurality of camera pixels is adjacent to two of the four edges of a corresponding first display pixel among the plurality of first display pixels.

2. The display device as described in claim 1, wherein the camera region comprises a plurality of pixel units; each of the plurality of pixel units comprises one of the plurality of camera pixels and one of the plurality of first display pixels; and a ratio of an area of the one of the plurality of camera pixels to an area of the one of the plurality of first display pixels falls within a range of 0.04 to 25.

3. The display device as described in claim 1, wherein the display device comprises a plurality of active elements and a plurality of color filter patterns, wherein the plurality of active elements and the plurality of color filter patterns are located outside the plurality of camera pixels and in the plurality of first display pixels and the plurality of second display pixels.

4. The display device as described in claim 3, wherein the display device further comprises a wire and a driving element, and the plurality of camera pixels are electrically connected to the driving element through the wire.

5. The display device as described in claim 4, wherein a number of the wires connected between the plurality of camera pixels and the driving element is multiple, wherein a line width of a longer wire of the plurality of wires is larger than a line width of a shorter wire of the plurality of wires.

6. The display device as described in claim 1, wherein a resolution of the camera region is lower than a resolution of the display region.

7. The display device as described in claim 1, wherein a pixel pitch of the plurality of first display pixels in the first direction is larger than a pixel pitch of the plurality of second display pixels in the first direction.

8. The display device as described in claim 1, wherein the plurality of camera pixels and the plurality of first display pixels are disposed in one of the first direction and the second direction; the plurality of camera pixels and the plurality of first display pixels are alternately disposed in the other of the first direction and the second direction; and the first direction intersects the second direction.

9. The display device as described in claim 1, wherein the plurality of first display pixels comprises a plurality of first blue pixels, a plurality of first green pixels, and a plurality of first red pixels; the plurality of first blue pixels, the plurality of first green pixels, and the plurality of first red pixels are disposed in one of the first direction and the second direction; the plurality of first blue pixels, the plurality of first green pixels, and the plurality of first red pixels are alternately disposed in the other of the first direction and the second direction; the first direction intersects the second direction; and one of the plurality of first blue pixels, one of the plurality of first green pixels, or one of the plurality of first red pixels is provided between any two adjacent camera pixels disposed in the other of the first direction and the second direction.

10. A driving method of display device, the display device comprising a camera region and a display region adjacent to the camera region, wherein the camera region comprises a plurality of camera pixels and a plurality of first display pixels and the display region comprises a plurality of second display pixels, wherein the driving method of display device comprises:
    placing the plurality of camera pixels in a state that a light beam is not allowed to pass through, in a display mode;
    placing the plurality of camera pixels in a state that a light beam is allowed to pass through, in a camera mode;
    making the plurality of camera pixels have an alternating positive/negative polarity in a first direction, making the plurality of first display pixels have an alternating positive/negative polarity in the first direction, making the plurality of second display pixels have an alternating positive/negative polarity in the first direction, making the plurality of first display pixels have a same polarity in a second direction, making the plurality of second display pixels have a same polarity in the second direction, and making the first direction intersects the second direction; and making each of the plurality of camera pixels opposite in polarity to adjacent first display pixel or first display pixels, wherein each of the plurality of first display pixels comprises four edges, and each of the plurality of camera pixels is adjacent to two of the four edges of a corresponding first display pixel among the plurality of first display pixels.

11. The driving method of display device as described in claim 10, wherein a state switching of the plurality of camera pixels occurs in a blanking time between two adjacent frames.

\* \* \* \* \*